United States Patent
Toops et al.

(10) Patent No.: US 8,381,075 B2
(45) Date of Patent: Feb. 19, 2013

(54) LOW-POWER REDUNDANCY FOR NON-VOLATILE MEMORY

(75) Inventors: David J. Toops, Terrell, TX (US); Sudhir K. Madan, Richardson, TX (US); Suresh Balasubramanian, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 349 days.

(21) Appl. No.: 12/958,724

(22) Filed: Dec. 2, 2010

(65) Prior Publication Data

US 2011/0231736 A1  Sep. 22, 2011

Related U.S. Application Data

(60) Provisional application No. 61/315,201, filed on Mar. 18, 2010.

(51) Int. Cl.
*G11C 29/00* (2006.01)

(52) U.S. Cl. .................. 714/768; 714/710; 365/185.07; 365/185.09; 365/200

(58) Field of Classification Search .................. 714/710, 714/768; 365/185.07, 185.09, 200
See application file for complete search history.

(56) References Cited

U.S. PATENT DOCUMENTS

| | | | |
|---|---|---|---|
| 2005/0270841 A1 * | 12/2005 | Merritt et al. | 365/185.09 |
| 2010/0211853 A1 | 8/2010 | Madan et al. | |

* cited by examiner

*Primary Examiner* — Guy Lamarre
(74) *Attorney, Agent, or Firm* — Rose Alyssa Keagy; Wade J. Brady, III; Frederick J. Telecky, Jr.

(57) ABSTRACT

A static RAM redundancy memory for use in combination with a non-volatile memory array, such as ferroelectric RAM (FRAM), in which the power consumption of the SRAM redundancy memory is reduced. Each word of the redundancy memory includes data bit cells for storing addresses of memory cells in the FRAM array to be replaced by redundant elements, and also enable bits indicating whether redundancy is enabled for those addresses. A logical combination of the enable bits in a given word determines whether the data bit cells in that word are powered-up. As a result, the power consumption of the redundancy memory is reduced to the extent that redundancy is not enabled for segments of the FRAM array.

19 Claims, 7 Drawing Sheets

LOW-POWER REDUNDANCY FOR NON-VOLATILE MEMORY

CROSS-REFERENCE TO RELATED APPLICATIONS

This application claims priority, under 35 U.S.C. §119(e), of Provisional Application No. 61/315,201, filed Mar. 18, 2010, incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory as realized in semiconductor integrated circuits. Embodiments of this invention are more specifically directed to the use of redundant memory cells to functionally replace defective memory cells in such memories.

Many modern electronic devices and systems now include substantial computational capability for controlling and managing a wide range of functions and useful applications. Many of these electronic devices and systems are now portable or handheld devices. For example, many mobile devices with significant computational capability are now available in the market, including modern mobile telephone handsets such as those commonly referred to as "smartphones", personal digital assistants (PDAs), mobile Internet devices, tablet-based personal computers, handheld scanners and data collectors, personal navigation devices, and the like. The power consumption of the electronic circuitry in those devices and systems is therefore of great concern, as battery life is often a significant factor in the buying decision as well as in the utility of the device or system. One type of mobile devices includes implantable battery-powered medical devices, such as pacemakers, defibrillators, and the like. Battery life is of special concern in these implantable medical devices, because surgery is required to replace the battery.

Many mobile devices, including implantable medical devices, now rely on solid-state memory not only for data storage during operation, but also as non-volatile memory for storing program instructions (e.g., firmware) and for storing the results and history of previous operations and calculations. Electrically-erasable programmable read-only memory (EEPROM) is a common type of solid-state non-volatile memory, particularly EEPROM of the "flash" type. Ferroelectric random-access memory (FeRAM or FRAM) is a popular non-volatile solid-state memory technology, particularly in implantable medical devices. Modern mobile devices typically include substantial non-volatile memory capacity, often amounting to as much as one or more gigabytes.

A continuing trend in the industry, particularly as applied to mobile devices including implantable medical devices, is to realize as many system functions as possible in a single integrated circuit. As such, large-scale integrated circuits now often include one or more central processing units (CPUs), co-processor functions as desired, one or more memory resources embedded on-chip for use as program and data memory, and various input/output and control functions. Examples of these large-scale integrated circuits are often referred to as a single-chip microcomputer, or a so-called "system-on-a-chip" (SoC).

The miniaturization of these integrated circuit functions is an important design goal, whether to minimize manufacturing cost or to provide a minimum form factor. Given the substantial memory capacity now required by these computationally sophisticated, a significant portion of the overall chip area is consumed in realizing solid-state memory, particularly non-volatile solid-state memory, even in large-scale SoC implementations. As such, memory cells are often realized by minimum size transistor gates and other features, considering the relatively large number of memory cells in even modest-sized memories. The manufacturing yield of modern SoC integrated circuits is thus often dominated by manufacturing defects in the memory arrays, considering that a relatively large portion of the overall chip area is consumed by the memory arrays, and that the memory arrays are constructed of a large number of closely-packed, minimum feature size, memory cells. A defective embedded on-chip memory causes the entire SoC to be unsuitable for system use, regardless of the functionality of the remainder of the integrated circuit.

As known in the art, yield loss due to memory defects can be alleviated by the use of redundant rows or columns (or both) of memory cells associated with the memory arrays. In a general sense, if one or more memory cells in the memory array fails electrical test, the memory is remapped to access a redundant row or column of memory cells instead of the row or column of the main array containing the defective cell or cells. To the outside, the memory appears to have all cells fully functional.

U.S. Patent Application Publication No. US 2010/0211853 A1, published Aug. 19, 2010, entitled "High Reliability and Low Power Redundancy for Memory", commonly assigned herewith and incorporated herein by this reference, describes a memory architecture with an FeRAM main array and a redundancy circuit. This publication discloses an example in which the redundancy circuit includes a static random access memory (SRAM) that stores the memory addresses to be replaced in each of multiple array segments, along with a repair enable bit that enables selection of the redundant row or column upon the redundant address matching the address of the desired memory location. A portion of FeRAM is provided for non-volatile storage of the redundant address and enable information; upon power-up, the contents of that FeRAM portion are written into the SRAM redundancy memory; the use of SRAM memory allows the redundancy decision to be made within the memory access cycle itself.

As mentioned above, power consumption of integrated circuit functions is an important concern in the design and manufacture of mobile electronic devices and systems, especially for implantable medical devices. It has been observed, however, that significant power remains being consumed by the SRAM redundancy memory, considering that this memory has at least one data word for each segment of the non-volatile array.

BRIEF SUMMARY OF THE INVENTION

Embodiments of this invention provide a non-volatile memory with redundant memory elements, and a method of operating the same, in which the power requirements of the redundancy circuit selecting the main array or redundant memory cells are reduced.

Embodiments of this invention provide such a non-volatile memory and method of operating the same that is well-suited for memory arrays arranged in multiple segments.

Embodiments of this invention provide such a non-volatile memory and method that is well-suited for memory arrays arranged into multiple partitions within each of the multiple segments.

Embodiments of this invention provide such a non-volatile memory and method that reduces vulnerability to soft-errors in the contents of the redundant memory.

Embodiments of this invention provide such a non-volatile memory and method that enables additional redundant memory resources within a given power consumption budget.

Other objects and advantages of embodiments of this invention will be apparent to those of ordinary skill in the art having reference to the following specification together with its drawings.

Embodiments of this invention may be realized by an integrated circuit containing a data array with redundant memory elements. A redundancy circuit that determines whether main memory array cells or redundant cells are accessed includes a static random access memory (SRAM) that stores the addresses to be replaced. Each data word in the redundancy SRAM includes the address to be replaced along with one or more enable bits indicating whether replacement is to be performed in the event of an address match. Power to the redundancy SRAM memory cells storing the addresses to be replaced is gated by the state of the enable bits. To the extent that redundancy is not enabled, power consumption in the redundancy SRAM is reduced.

According to another aspect of the invention, multiple redundant elements (rows and columns) are available for each main memory array segment, each associated with an address and an enable bit. The enabling of any one of the multiple redundant elements enables all redundant elements for the segment. An enable signal for the segment is generated from a "majority encoding" of the multiple enable bits. Vulnerability to soft-error failure of a single redundant enable bit in the redundancy SRAM is thus eliminated.

DETAILED DESCRIPTION OF THE INVENTION

The present invention will be described in connection with its embodiments, namely as implemented into an integrated circuit including a ferroelectric random access memory (FRAM, or FeRAM), because it is contemplated that this invention will be of particular benefit in such an application. However, it is also contemplated that this invention may be used to advantage in other memory and integrated circuit architectures beyond that described herein. Accordingly, it is to be understood that the following description is provided by way of example only, and is not intended to limit the true scope of this invention as claimed.

Modern solid-state memory is realized by various memory technologies. Static random access memory (SRAM) is now commonplace in many modern electronic systems. As is fundamental in the art, SRAM cells store data "statically", in that the stored data state remains latched in each cell so long as power is applied to the memory. Typically, each SRAM cell is constructed as a cross-coupled pair of inverters, in a six-transistor (6-T) arrangement. Another solid-state memory type is referred to as dynamic RAM (DRAM), which realizes each memory cell as a single capacitor in combination with a single pass transistor; refresh of the stored data states is necessary in DRAM. Various types of non-volatile memory, including mask-programmable read-only memory (ROM), electrically erasable programmable read-only memory (EEPROM), ferroelectric RAM (FRAM, or FeRAM), and the like are well-known in the art. In particular, FRAM cells may be implemented in various forms, including as a one-transistor, one-capacitor (1-T, 1-C) memory cell similar to a typical DRAM cell, and also in combination with a six-transistor (6-T) SRAM cell in which one or two ferroelectric capacitors are coupled to corresponding cross-coupled nodes to retain the data state after power is removed. As will become evident from the following description and as noted above, while embodiments of this invention will be described as applied to an FRAM memory array, it is contemplated that this invention can also be beneficially implemented in connection with other solid-state memory types.

Figure 1:
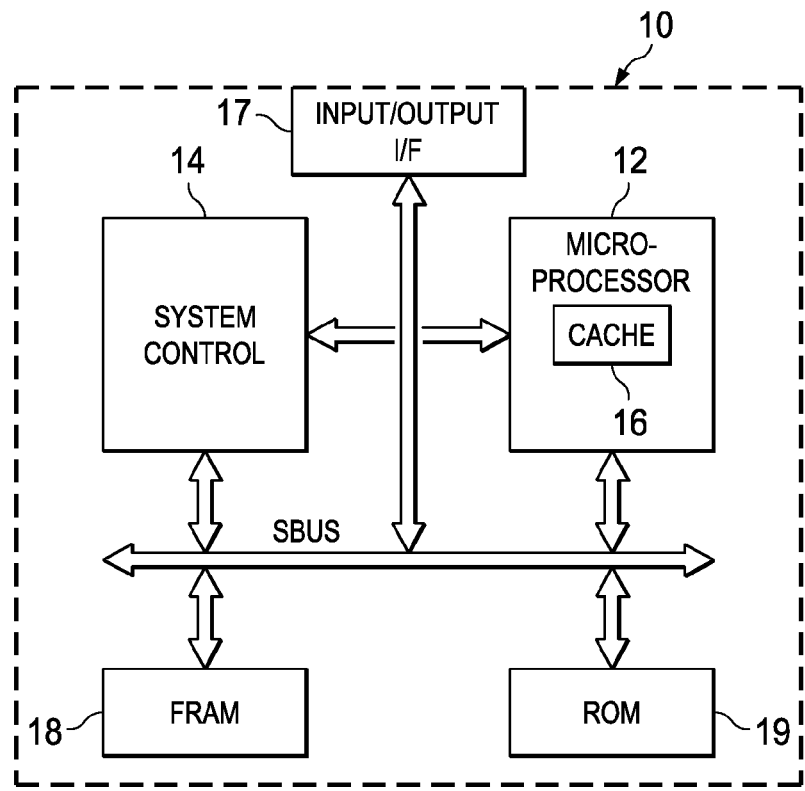
FIG. 1 is an electrical diagram, in block form, of an integrated circuit including memory resources, constructed according to embodiments of the invention.

FIG. 1 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including non-volatile random access memory of the ferroelectric type (FRAM) 18 and read-only memory (ROM) 19, reside on system bus SBUS and are thus accessible to microprocessor 12. Typically, ROM 19 serves as program memory, storing the program instructions executable by microprocessor 12, while FRAM 18 serves as data memory; in some cases, program instructions may reside in FRAM 18 for recall and execution by microprocessor 12, considering its non-volatility. Cache memory 16 (such as level 1, level 2, and level 3 caches), typically implemented as SRAM provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 1, or may have its functions arranged according to a different architecture from that shown in FIG. 1. The architecture and functionality of integrated circuit 10 is thus provided only by way of example, and is not intended to limit the scope of this invention.

By way of example, embodiments of this invention will be described in this specification in connection with FRAM 18. It is contemplated that those skilled in the art having reference to this specification, and the example of the application of embodiments of this invention to the memory array of FRAM 18, can readily apply the invention in the construction of other types of memory, and in the construction of array-based logic and other integrated circuit functions.

Figure 2:
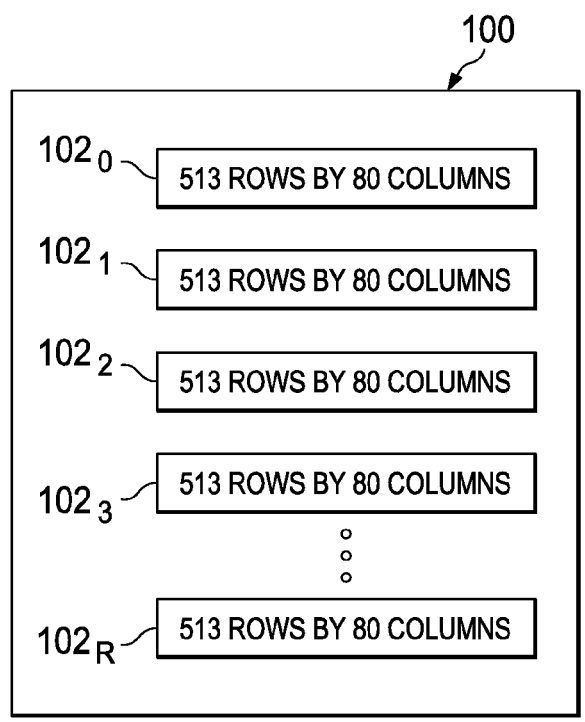
FIG. 2 is a memory map of an example of a non-volatile memory in the integrated circuit of FIG. 1, constructed according to embodiments of the invention.

FIG. 2 illustrates the logical arrangement of memory array 100 in FRAM 18, according to one example. In this case, memory array 100 is arranged in multiple memory segments 102$_0$ through 102$_R$. In this illustrative example, each segment 102 consists of 80 columns and 513 rows of memory cells, where each row spans all 80 columns. Segments 102 having a different number of rows and columns may alternatively be realized. According to embodiments of this invention, one or more of the rows, one or more of the columns, or both rows and columns, in each segment 102 are reserved as redundant rows or columns for "repair" of other rows or columns in that memory segment that are defective. The manner of this "repair" is re-mapping of the address of the defective row or column to a redundant row or column. For example, each memory segment 102 may contain one redundant row, and one redundant column per word width.

Figure 3:
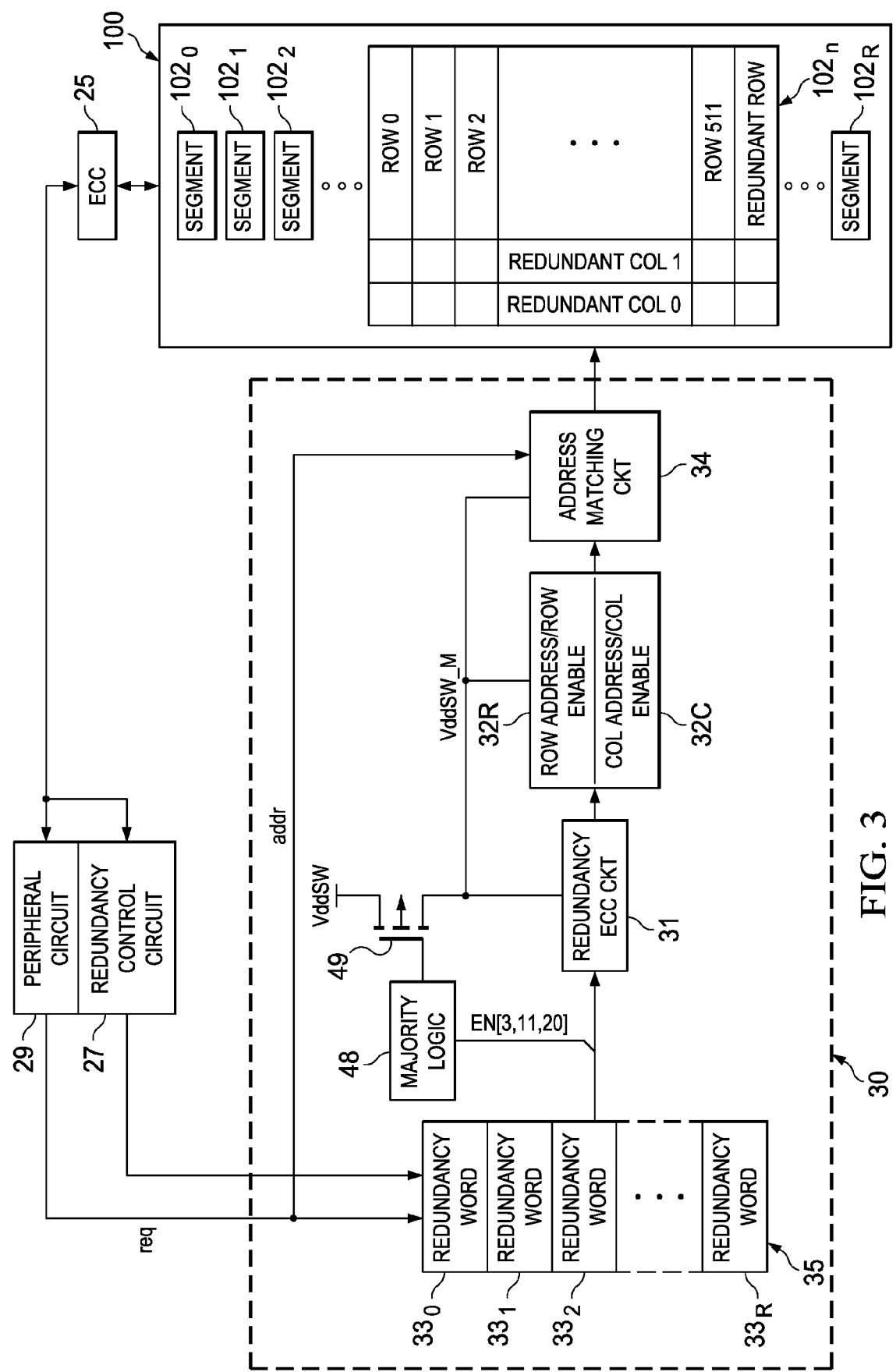
FIG. 3 is an electrical diagram, in block form, of a non-volatile memory in the integrated circuit of FIG. 1, constructed according to embodiments of the invention.

FIG. 3 illustrates the architecture of FRAM 18 according to an embodiment of this invention. The architecture shown in FIG. 3 and described herein is described in further detail in U.S. Patent Application Publication No. US 2007/0211853 A1, commonly assigned herewith and incorporated herein by this reference. As shown in FIG. 3, FRAM 18 includes FRAM memory array 100, arranged as described above, in combination with redundancy circuit 30. Redundancy circuit 30 includes redundancy memory 35, which in this example is implemented by SRAM; redundancy error correction circuit 31; buffers 32R, 32C for storing corrected address results from redundancy error correction circuit 31; and address matching circuit 34. Redundancy memory 35 is arranged to include multiple redundancy words 33$_0$ through 33$_R$, each associated with a corresponding segment 102$_0$ through 102$_8$, respectively, in FRAM data array 100. For example, redundancy word 33$_1$ in redundancy memory 35 has a one-to-one correspondence with memory segment 102$_1$ in FRAM data array 100. This association of redundancy words 33 with corresponding memory segments 102 avoids the need to check each word in redundancy memory 35 for a possible match in response to a particular address; only the redundancy word 33 associated with the particular one of segments 102 indicated by the memory address need be checked.

FRAM 18 according to this embodiment of the invention also includes peripheral circuitry 29, which refers to the usual address, clock, control, and input/output circuits typically involved in FRAM 18 and other memory architectures. Error correction circuit 25 for performing conventional error correction on data words retrieved from an addressed location of FRAM data array 100, or error correction coding on data words to be written to an addressed location. As such, error correction circuit 25 is in communication with memory array 100 and with peripheral circuitry 29, in the usual manner. In addition, FRAM 18 according to embodiments of this invention also includes redundancy control circuit 27, which includes the appropriate control circuitry for storing the memory addresses to be replaced in the appropriate redundancy words 33, and for setting the corresponding enable bits.

The architecture of FRAM 18 shown in FIG. 3 and described above is, of course, provided only by way of example. FRAM 18 including memory array 100 and redundancy memory 35 may be constructed according to the other architectures described in the above-incorporated U.S. Patent Application Publication No. US 2007/0211853 A1, and in such other architectures as will be apparent to those skilled in the art having reference to this specification.

In its general operation, redundancy words 33 in redundancy memory 35 of FRAM 18 will store the row and column addresses of memory locations within corresponding segments 102 that are to be replaced by a redundant row or redundant column in that segment 102, and corresponding enable bits within redundancy word 33 will be set. In this example, as shown in connection with segment 102$_n$ and as described above, each segment 102 includes one redundant row and two redundant columns. Of course, the particular number of rows and columns, and redundant rows and columns, may vary from this example, and indeed may vary among segments 102 in array 100. As will be described in further detail below, the addresses that require repair may be stored within one of segments 102 in memory array 100 during final test, so as to remain in non-volatile storage within FRAM 18 after power-down. At power up, these repair addresses are written by redundancy control circuit 27 into the corresponding redundancy words 33 in redundancy memory 35, along with error correcting bits. FRAM 18 is then ready for access.

In this example, periphery circuit 29 issues a memory access request for data from a particular address in a particular segment, as indicated in a segment address value forwarded to redundancy memory 35; the particular row and column address is forwarded to address matching circuit 34. Redundancy circuit 30 causes selection of the corresponding redundancy word 33, the contents of which are forwarded to redundancy ECC circuit 31 for verification. The contents of the selected redundancy word 33 (corrected if needed) are buffered in buffers 32R, 32C. Address matching circuit 34 determines whether the repair enable bit for the selected segment 102 is set, and if so, compares the contents of buffers 32R, 32C with the memory address value forwarded from peripheral circuit 29. If no match is present, address matching circuit 34 forwards the address value from peripheral circuit 29 to array 100 for selection and access of the corresponding memory location in the desired segment 102. If a match is present (with the enable bit set), address matching circuit 34 forwards the address of the appropriate redundant row or column (or both) to array 100, so that the memory location in the redundant row or column in the desired segment 102 is instead accessed, effectively remapping the address of the row or column previously found to be defective. In either case, read or write access of the appropriate location within the desired segment 102 of array 100 is carried out by peripheral circuit 29, along with error correction coding or detection and correction by ECC 25 in the usual manner.

In this architecture, redundancy memory 35 is constructed as CMOS SRAM, to provide relatively fast access to the desired memory locations in FRAM array 100. However, as mentioned above, this SRAM implementation will involve some level of static power consumption, even though realized by way of CMOS inverters. Certain system implementations, such as implantable medical devices, are especially sensitive to power consumption, in that battery replacement is inconvenient and costly. According to embodiments of this invention, the power consumed by redundancy memory 35 is greatly reduced by virtue of its construction and operation, as will now be described.

Figure 4:
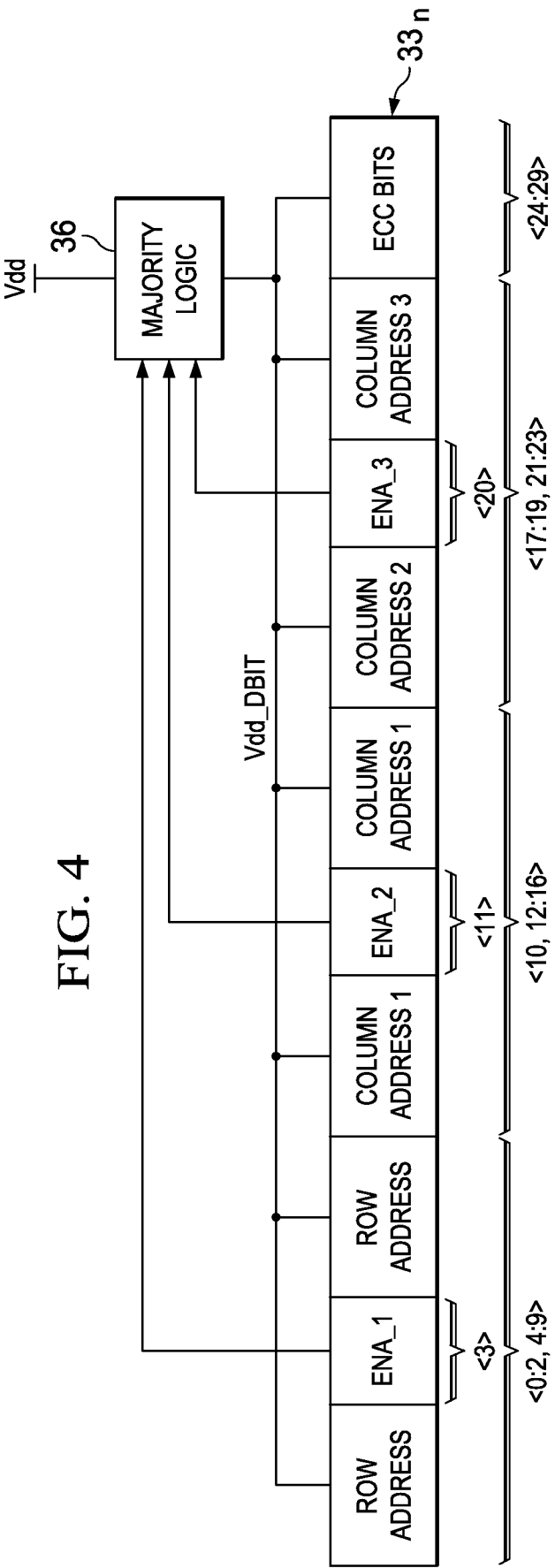
FIG. 4 is a map of the contents of a redundancy word in the redundancy memory of the memory of FIG. 3, according to embodiments of the invention.

FIG. 4 illustrates an example of an arrangement of the contents of one of redundancy words 33$_n$ stored in redundancy memory 35, according to embodiments of this invention. In this example, each segment 102 includes one redundant row of memory cells and two redundant columns, with one redundant column associated with even-numbered columns in segment 102, and the other redundant column associated with odd-numbered columns in that segment 102. As such, redundancy word $33_n$ associated with segment $102_n$ stores one row address and two column addresses, those addresses indicating the row and columns of associated segment $102_n$ that are to be replaced with the redundant row and columns, respectively, if indicated by enable bits also stored within redundancy word $33_n$. Redundancy word $33_n$ also stores parity bits that result from the application of an error correction code to the data bits to be stored in the address and enable bit fields. These parity bit values are typically generated a priori, at the time of manufacture. Error correction of the contents of redundancy word $33_n$ is especially useful in embodiments of this invention that are applied to error-sensitive systems, such as implantable medical devices.

In the example shown in FIG. 4, bits within redundancy word $33_n$ are assigned as:

| Field | Bits in redundancy word $33_n$ |
|---|---|
| Replaced row address | <0:2, 4:9> |
| Replaced column address 1 (for even-numbered columns) | <10, 12:16> |
| Replaced column address 2 (for odd-numbered columns) | <17:19, 21:23> |
| Segment enable bits | <3, 11, 20> |
| Error correction code (parity) bits | <24:29> |

Of course, the particular bits assigned to particular fields can vary from that shown in FIG. 4. In this example, as will become apparent from the following description, the three enable bits are not necessarily assigned to specific fields, as the redundant row and both redundant columns are all enabled if any one of the elements is to be enabled. This arrangement eliminates the vulnerability of soft-error failure at one of the enable bits. Alternatively, at the cost of such vulnerability, one enable bit may be assigned to each of the addresses, such that the redundant row, and the redundant columns, may be separately enabled based on the state of that single enable bit (e.g., enable bit <3> in a set state enables row redundancy, even if enable bits <11> and <20> are clear because neither of the redundant columns are used).

According to embodiments of this invention, data bit cells in redundancy memory 35 used to store the address values and error correction code parity bits are constructed differently than are the enable bit cells used to store the enable bits. More specifically, the power supply bias applied to the data bit cells is gated by the state of the enable bit cells. In the example shown in FIG. 4, the enable bit cells are biased directly from power supply node Vdd, while the data bit cells are biased from power supply node Vdd_DBIT generated by majority logic 36 within redundancy circuit 30. Majority logic 36 generates (i.e., forwards) bias voltage from power supply node Vdd responsive to the current states of enable bits <3>, <11>, <20> in redundancy word $33_n$. According to this embodiment of the invention, the data bit cells in redundancy words 33 associated with segments 102 in which redundancy is not enabled (e.g., if none of the memory cells in its associated segment is defective) will not be biased, and thus will not consume power.

Especially as the manufacturing yield goes up (the probability of defective memory cells goes down), the power savings provided by embodiments of this invention will increase.

Figure 5A:
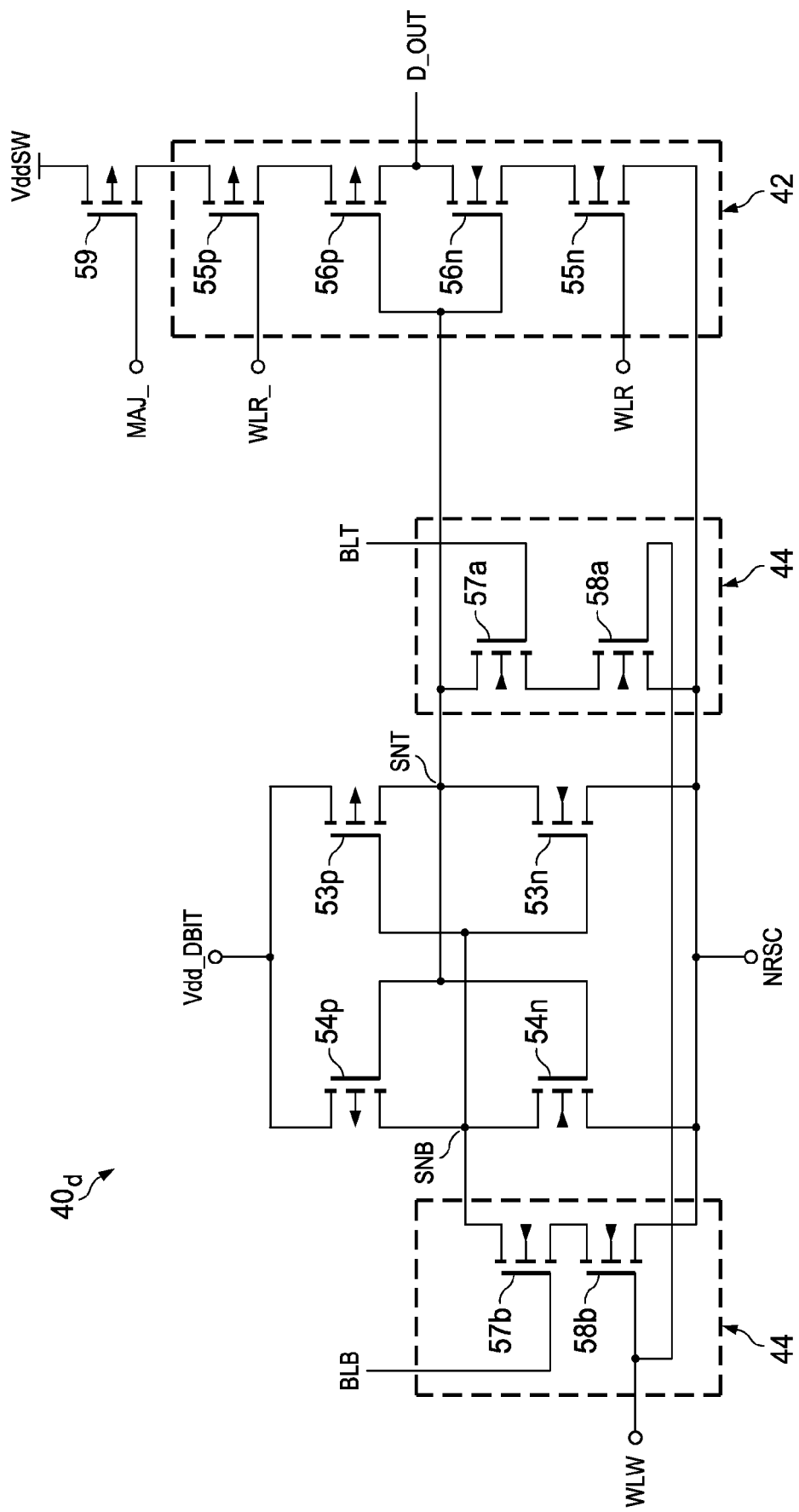
FIGS. 5a and 5b are electrical diagrams, in schematic form, of data bit cells and enable bit cells, in the redundancy memory of FIG. 3 according to embodiments of this invention.

FIG. 5a illustrates the construction of data bit cell $40_d$ as used within redundancy words 33 of redundancy memory 35, according to an embodiment of this invention. In this example, data bit cell $40_d$ is based on a pair of cross-coupled CMOS inverters, one inverter of series-connected p-channel load transistor 53p and n-channel driver transistor 53n, and the other inverter of series-connected p-channel load transistor 54p and n-channel transistor 54n; the gates of the transistors in each inverter are connected together and to the common drain node of the transistors in the other inverter, in the usual manner. The common drain node of transistors 53p, 53n constitutes storage node SNT, and the common drain node of transistors 54p, 54n constitutes storage node SNB, in this example. The source nodes of load transistors 53p, 54p are biased from power supply node Vdd_DBIT in this embodiment of the invention, and the source nodes of driver transistors 53n, 54n are connected to ground reference voltage NRSC, which is a gated ground voltage as will be described in further detail below.

To reduce power consumption, data bit cell $40_d$ also includes read buffer 42 and write circuit 44. Read buffer 42 in this example is constructed as a CMOS inverter of p-channel transistor 56p and n-channel transistor 56n with their drains connected in common to output node D_OUT, and their gates connected in common to storage node SNT. P-channel transistor 55p has its drain connected to the source of transistor 56p, and n-channel transistor 55n has its source-drain path connected between the source of transistor 56n and gated ground reference voltage node NRSC. The source of transistor 55p is coupled to power supply voltage VddSW through p-channel transistor 59, which has its gate controlled by a majority logic signal MAJ_ as will be described in further detail below. The gates of transistors 55n, 55p receive complementary read word line signals WLR, WLR_, respectively. Write circuit 44 includes true and complementary portions, similarly constructed as one another. On the "true" side, write circuit 44 includes n-channel transistor 57a with its drain connected to storage node SNT and its gate connected to bit line BLT, and n-channel transistor 58a with its drain connected to the source of transistor 57a, its source at ground Vss, and its gate receiving write word line WLW. The "complement" side of write circuit 44 similarly includes re-channel transistors 57b, 58b connected in series between storage node SNB and ground, with the gate of transistor 57b connected to bit line BLB and the gate of transistor 58b receiving write word line WLW. To further minimize power consumption, the body node (i.e., "back gate") of each of the p-channel transistors in data bit cell $40_d$ are preferably biased to a higher voltage than the power supply voltages VddSW and Vdd_DBIT. For example, if power supply voltage Vdd is nominally at 1.5 volts, a back-gate bias of 1.9 volts to the body nodes of the p-channel transistors would further reduce the leakage through these devices.

Figure 5B:
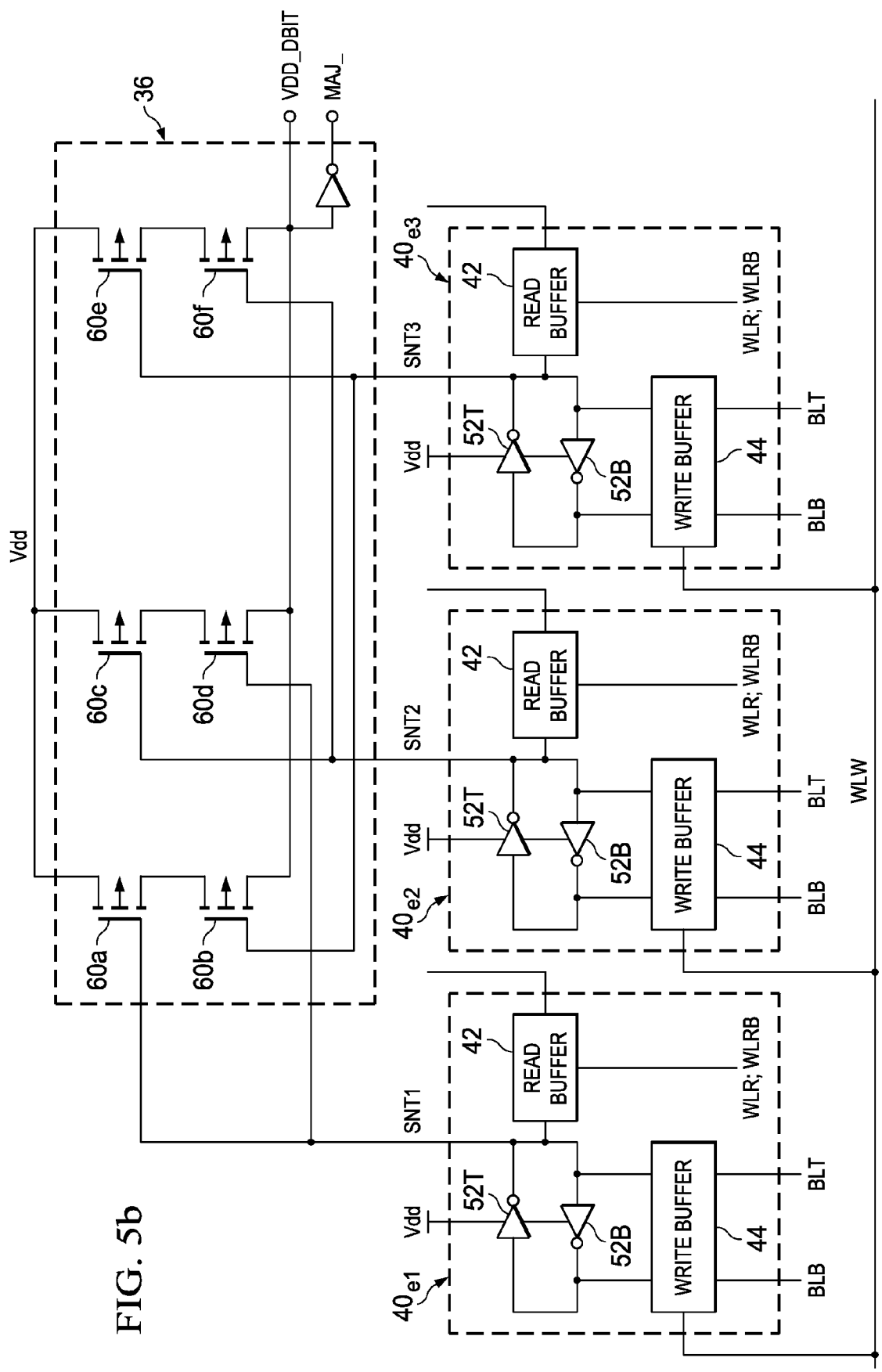
Figure 5C:
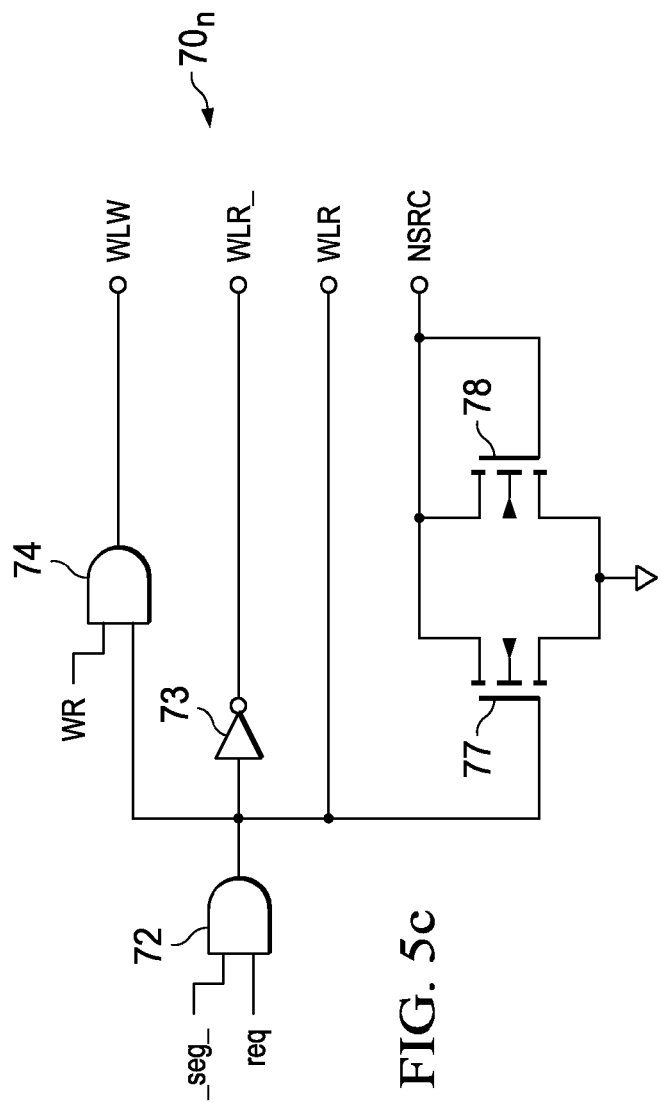
FIGS. 5c and 5d are electrical diagrams, in schematic form, of word line driver circuitry and power gating circuitry, respectively, in the redundancy memory of FIG. 3 according to embodiments of this invention.

FIG. 5c illustrates the construction of word line driver $70_n$ associated with redundancy word $33_n$ in redundancy memory 35, according to an example of embodiments of this invention. Word line driver $70_n$ includes AND gate 72, which has a first input receiving address signal _seg_ and a second input receiving the request control signal req. Address signal _seg_ may be a control signal generated by row address decode circuitry (not shown), as decoded in the conventional manner from the segment portion of the address of FRAM array 100 being accessed in a particular memory address cycle, and indicating, when active, that a memory address in segment $102_n$ corresponding to redundancy word $33_n$ is being accessed. Additional decoded (or undecoded) address portions may also or instead be applied to AND gate 72, as appropriate for the architecture. Request control signal req is a control signal from peripheral circuit 29 (FIG. 3) indicating that a memory access is desired, and enabling circuits in redundancy circuit 30 accordingly, and thus enables AND gate 72 to respond to the decoded address signal _seg_.

Figure 5D:
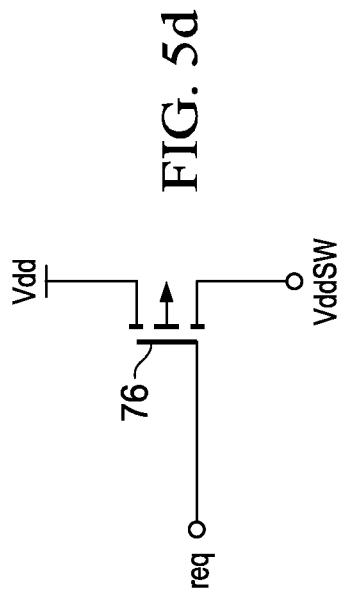

Request control signal req is also involved in power-switching power supply voltage VddSW, as shown in FIG. 5d. In this example, p-channel pass transistor 76 receives request control signal req_, and connects power supply voltage Vdd to gated power supply voltage node VddSW in response to request control signal req_ being asserted (active low). This gating of power supply voltage node VddSW enables read buffers 42 in each bit cell of redundancy memory 35 to be isolated from power supply voltage Vdd during such time as FRAM 18, and thus redundancy memory 35, are in standby, further reducing power consumption in this mode.

Referring back to FIG. 5c, a high logic level output from AND gate 72, in this example, indicates that redundancy word $33_n$ is to be accessed for comparison against a received memory address. This active level is forwarded as an active high level on read word line WLR, and via inverter 73 as an active low logic level on read word line WLR_, to read buffers 44 in each of data bit cells $40_d$ and enable bit cells $40_{e1}$ through $40_{e3}$. As shown in FIG. 5c, this output of AND gate 72 is also applied to one input of AND gate 74, a second input of which receives write control signal WR. Write control signal WR in this example indicates a write cycle is to be performed by an active high level, and conversely indicates a read cycle when at a low logic level. Write word line WLW is driven active high by AND gate 74 in word line driver $70_n$ only during write cycles to redundancy word $33_n$.

Gated ground reference voltage NSRC is also produced individually for each redundancy word $33_n$, by its corresponding word line driver $70_n$ in this example. As shown in the example of FIG. 5c, the output of AND gate 72 is applied to the gate of n-channel transistor 77, which has its drain at node NSRC and its source at ground (Vss). N-channel transistor 78 is connected in diode fashion, and in parallel with the source/drain path of transistor 77, having its gate and drain at node NSRC and its source at ground. Accordingly, in response to the selection of redundancy word $33_n$ for access in a given memory cycle (the output of AND gate 72 active high), transistor 77 is turned on and gated ground reference voltage node NSRC is biased directly to ground through transistor 77. During such time as redundancy word $33_n$ is not selected, the output of AND gate 72 is inactive low, transistor 77 is turned off, and gated ground reference node NSRC is allowed to float up to a level no more than a diode voltage drop ($V_t$ of transistor 78) above ground voltage Vss. In this state, leakage current of the bit cells of redundancy word $33_n$ is further reduced in standby, while not affecting data state retention.

The operation of data bit cell $40_d$ in an enabled redundancy word $33_n$ assumes that power supply voltage Vdd_DBIT is at or near power supply voltage Vdd, and control signal MAJ_ is at a low logic level to turn on transistor 59, both conditions to be described below. In read cycles, read word lines WLR, WLR_ are energized to their respective active high and low levels, allowing the inverter of transistors 56p, 56n to output the state of data bit cell $40_d$; in write cycles, read word lines WLR, WLR_ are held low and high, respectively, preventing power consumption through read buffer 42. In write cycles, write word line WLW is energized to a high level after the desired data state is applied to bit lines BLB, BLT; transistors 58a, 58b are both turned on in this event, allowing the complementary logic levels at bit lines BLT, BLB to determine which of storage nodes SNT, SNB is pulled to ground, setting the state of data bit cell $40_d$.

Data bit cell $40_d$ may be constructed in alternative ways from that shown in FIG. 5a, of course. For example, cell $40_d$ may be constructed as a conventional six-transistor (6-T) static memory cell, biased between the voltage at power supply node Vdd_DBIT and ground reference voltage Vss.

FIG. 5b illustrates the construction of enable bit cells $40_{e1}$ through $40_{e3}$, and of majority logic 36, according to an embodiment of this invention. In this embodiment of the invention, each of enable bit cells $40_{e1}$ through $40_{e3}$ is constructed similarly as data bit cell $40_d$ described above relative to FIG. 5a. To summarize, as shown in FIG. 5b, each of enable bit cells $40_{e1}$ through $40_{e3}$ includes cross-coupled inverters 52T, 52B, read buffer 42, and write circuit 44. In this example, however, inverters 52T, 52B are biased from power supply voltage Vdd, rather than from power supply node Vdd_DBIT. This power supply voltage Vdd (or a similar power supply voltage) is also applied to majority logic 36, as shown in FIG. 5b. While not shown in FIG. 5b, each of enable bit cells $40_{e1}$ through $40_{e3}$ is biased, on the ground side, from gated ground reference NSRC as described above for data bit cell $40_d$, and read buffers 42 in enable bit cells $40_{e1}$ through $40_{e3}$ is biased from switched power supply voltage VddSW.

Storage node SNT of each of enable bit cells $40_{e1}$, $40_{e2}$, $40_{e3}$ is applied to majority logic 36, via lines SNT1, SNT2, SNT3, respectively. In this embodiment of the invention, lines SNT1 through SNT3 directly convey the state of enable bit cells $40_{e1}$ through $40_{e3}$ without requiring the energizing of read buffers 42. Within majority logic 36, three pairs of series-connected n-channel transistors 60 operate to selectively generate the voltage at power supply node Vdd_DBIT from power supply voltage Vdd, based on the majority "vote" of the states of enable bit cells $40_{e1}$ through $40_{e3}$. In this example, transistors 60a, 60b have their source-drain paths connected in series between power supply voltage Vdd and power supply node Vdd_DBIT, and their gates receiving lines SNT1, SNT3, respectively. Similarly, transistors 60c, 60d have their source-drain paths connected in series between power supply voltage Vdd and power supply node Vdd_DBIT, and their gates receiving lines SNT2, SNT1, respectively. And transistors 60e, 60f have their source-drain paths connected in series between power supply voltage Vdd and power supply node Vdd_DBIT, and their gates receiving lines SNT3, SNT2, respectively. Accordingly, if storage node SNT is at a high logic level (i.e., indicating that its enable bit cell $40_e$ is "set") in any two of enable bit cells $40_{e1}$, $40_{e2}$, $40_{e3}$, then at least one pair of transistors 60 will both be turned on, connecting power supply voltage Vdd to power supply node Vdd_DBIT and thus powering-up data bit cells $40_d$ in that redundancy word 33. Conversely, if at most one of enable bit cells $40_{e1}$, $40_{e2}$, $40_{e3}$ is set, then none of the pairs of transistors 60 will have both transistors on, and power supply node Vdd_DBIT will be isolated from power supply voltage Vdd; data bit cells $40_d$ in that redundancy word 33 will thus not be powered up, and no power will be dissipated by those data bit cells $40_d$. Majority control signal MAJ_ is generated from power supply voltage Vdd_DBIT (via an inverter as shown), and is applied to the gates of p-channel transistors 59 in each of data bit cells $40_d$ and enable bit cells $40_{e1}$ through $40_{e3}$ for this redundancy word 33, as described above.

According to embodiments of this invention, therefore, the states of enable bit cells $40_e$ (e.g., the majority of enable bit cells $40_e$ in a given redundancy word 33) determine whether the corresponding data bit cells $40_d$ in the same redundancy word 33 are biased and thus operable. Of course, data bit cells $40_d$ must have this power supply bias in order to store the desired memory address portions to be repaired by redundant rows and columns. It is therefore beneficial for write cycles to redundancy memory 35 to be relatively long cycles. More specifically, redundancy memory write cycles to each redundancy word 33 should be sufficiently long that the set states written into enable bit cells 40$_e$ can propagate through majority logic 36, and energize power supply node Vdd_DBIT for sufficient time that data bit cells 40$_d$ in that redundancy word 33 are biased to reliably retain the written data state.

Also according to this embodiment of the invention, as discussed above, if any redundant element (row or column) is enabled for use for a given segment 102, then all redundant elements for that segment 102 will be enabled, and all of enable bit cells 40$_e$ for that redundancy circuit 30 will be set. In this embodiment of the invention, the majority vote scheme enforced by majority logic 36 allows for the possibility of a "soft" error at one of enable bit cells 40$_e$. In the case in which all of enable bit cells 40$_{e1}$, 40$_{e2}$, 40$_{e3}$ are set, and a soft error changes the state of one of those cells to "clear", the state of two of lines SNT1, SNT2, SNT3 will still remain high, and majority logic 36 will still connect power supply node Vdd_DBIT to power supply voltage Vdd, maintaining power supply bias to data cells 40$_d$ in that redundancy word 33. Conversely, if all of enable bit cells 40$_{e1}$, 40$_{e2}$, 40$_{e3}$ are intended to be "clear", but a soft error causes one of those cells to change state to "set", the single "set" state on only one of lines SNT1, SNT2, SNT3 will not cause power supply node Vdd_DBIT to connect to power supply voltage Vdd, and data cells 40$_d$ in that redundancy word 33 will remain powered down.

It is understood that the requirement of enabling all redundant elements for a segment 102 if any redundant elements are to be enabled (i.e., a "set one, set all" scheme) will cause replacement of known "good" cells in the main data array of that segment 102. However, it is contemplated that segments 102 in array 100 will be constructed so that the use of a redundant memory cell rather than a main memory cell is effectively transparent to the user. In that event, the particular memory address retained within the address fields for the replacement of the otherwise "good" row or columns is not important, and may simply remain at a random or otherwise initialized value. Since the number of rows is a power of two, in this implementation, row repair will necessarily be enabled if two of the three enable bits are set; on the other hand, column repair can be disabled by storing an "out of range" address in the address field of the corresponding redundancy word 33.

Alternatively, of course, other combinational logic functions may be applied to the states of enable bit cells 40$_e$ in redundancy words 33, as desired for the particular function to be carried out. As mentioned above, individual portions of each redundancy word 33 may instead have their power supply bias gated by one or more of enable bit cells 40$_e$ in that redundancy word. Further in the alternative, the number of enable bit cells 40$_e$ may of course vary from three, and the particular combination of that number of enable bit cells 40$_e$ may differ from a simple majority vote. Furthermore, as described above in this embodiment of the invention, the biasing of data bit cells 40$_d$ is performed individually for each redundancy word 33. It is contemplated that this power supply bias control may be varied from this by-word approach in some implementations. It is contemplated that those skilled in the art having reference to this specification can readily derive the particular logical combination of these enable bits 40$_e$, and the granularity of control, for biasing the data bit cells 40$_d$ in redundancy words 33 according to such other alternative realization as deemed useful in a particular application.

Referring back to FIG. 3, power consumption within redundancy circuit 30 is further reduced by the provision of another instance of majority logic 48, beyond that contained within each redundancy word 33 as described above. Majority logic 48 receives the state of enable bits 40$_e$ in the contents of an accessed redundancy word 33$_n$, and generates an output signal in similar manner as majority signal MAJ_ described above relative to FIG. 5b. This output signal is applied to the gate of power p-channel transistor 49, which has its source/drain path connected between gated power supply voltage node VddSW, and power supply voltage node VddSW_M. Power supply voltage node VddSW_M biases the decoding circuitry in redundancy circuit 30 in this embodiment of the invention, such decoding circuitry including redundancy ECC circuit 31, redundancy address buffers 32R, 32C, and address matching circuit 34. Accordingly, this decoding circuitry is only biased during the operation of redundancy circuit 30, and only then in response to the majority "vote" of enable bit cells 40$_e$ of the accessed redundancy word 33$_n$ indicating that redundancy is properly enabled for those redundant addresses. Active and leakage power consumption are thus reduced in this decoding circuitry, during such time as the addressed segment 102 does not require redundancy repair.

Figure 6:
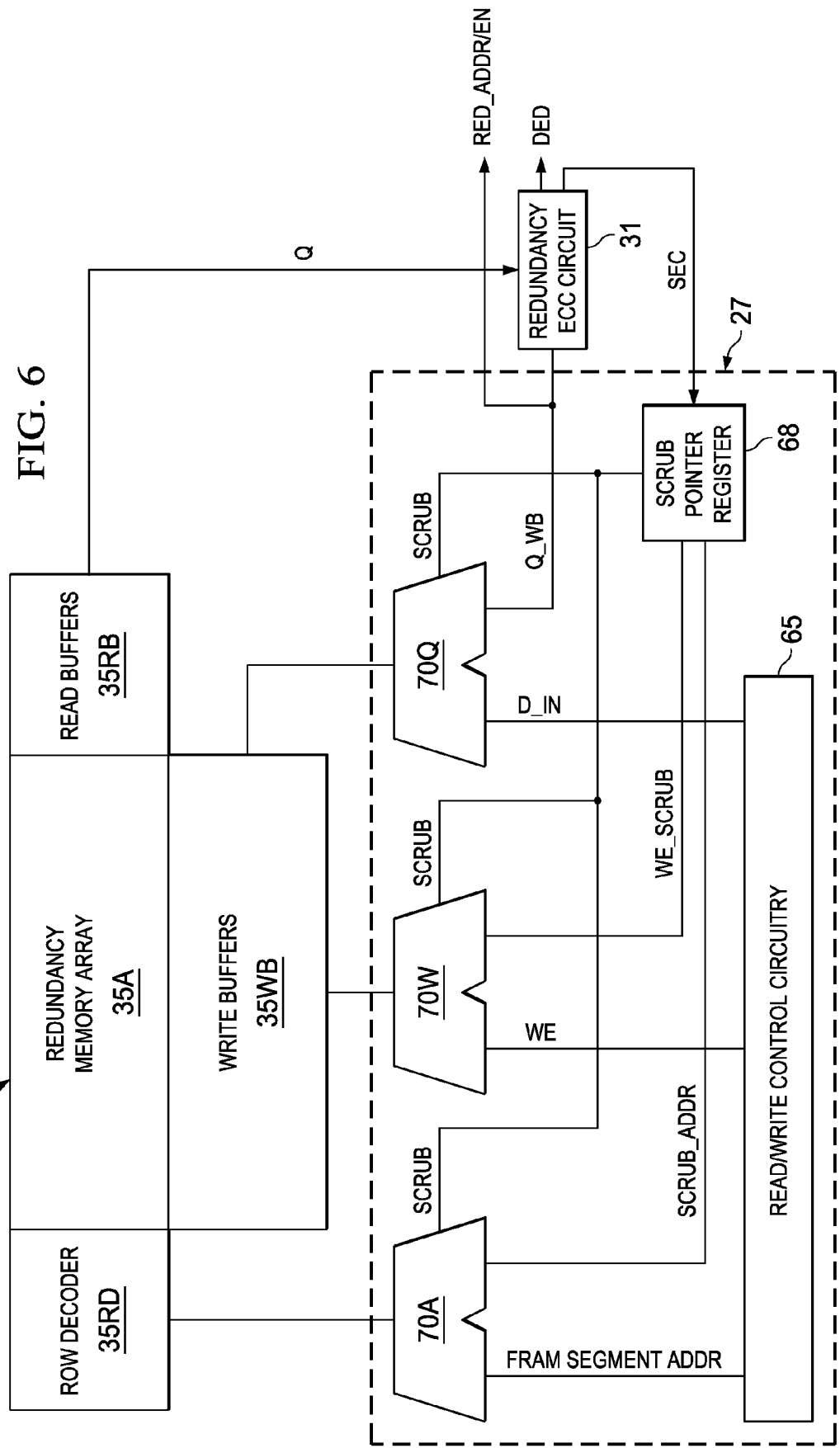
FIG. 6 is an electrical diagram, in block form, of the redundancy memory in the memory of FIG. 3, according to embodiments of the invention.

FIG. 6 illustrates an example of the architecture of redundancy control circuit 27, and its interaction with redundancy memory 35, according to embodiments of this invention. As illustrated in FIG. 6, redundancy memory 35 includes memory array 35A, which includes data bit cells 40$_d$ and enable bit cells 40$_e$ of the SRAM type, as described above, arranged in rows and columns. Each row of data bit cells 42$_d$ and enable bit cells 42$_e$ constitutes an instance of redundancy words 33, in this example. Redundancy memory 35 also includes conventional memory peripheral circuits such as row decoder 35RD, write buffers 35WB, read buffers 35RB, and other necessary and similar circuitry (not shown). Read buffers 35RB drive output lines Q, which are connected to redundancy ECC circuit 31 for error detection and correction, as described above relative to FIG. 3.

Redundancy control circuit 27 includes read/write control circuitry 65, which generally includes the appropriate logic for accessing redundancy memory array 35A. It is contemplated that those skilled in the art having reference to this description will be readily able to select and realize the appropriate logic and other circuitry appropriate for a particular implementation of read/write control circuitry 65. In this example in which each redundancy word 33 is associated with a segment 102 of array 100, and occupies a row of redundancy memory array 35A, the FRAM segment address indicates the row of redundancy memory array 35A to be accessed. As such, read/write control circuitry 65 generates and forwards FRAM segment address values to row decoder 35RD via multiplexer 70A to access one of redundancy words 33 for read or write operations.

For normal writes to redundancy memory 35, read/write control circuitry 65 generates and forwards write enable control signal WE to write buffers 35WB via multiplexer 70W (control signal SCRUB being inactive for this operation, as will be described below). The contents to be written to this selected redundancy word 33 (including data, enable bit states, and the corresponding ECC parity bit values) are generally determined at the time of manufacture of integrated circuit 10, and stored in non-volatile memory, for example in segment 102R of array 100. In this case, these contents are typically read from segment 102R on power-up of integrated circuit 10 (error-corrected via ECC circuit 25 of FIG. 3), and forwarded to read/write control circuitry 65, which in turn forwards those values to write buffers 35B on lines D_IN via multiplexer 70Q (control signal SCRUB inactive). As mentioned above, write cycles to redundancy memory 35 should be of relatively long duration, to allow the newly-written set states of enable bits 40$_e$ of redundancy word 33 to enable power supply bias to be applied to data bits 40$_d$ of that redundancy word 33, ensuring reliable storage of the addresses to be replaced. And as discussed above relative to FIG. 3, on access of a particular address location in array 100, read/write control circuitry 65 will provide an FRAM segment address value to row decoder 35RD via multiplexer 70A (control signal SCRUB inactive), along with an inactive write enable level on line WE. These signals will access redundancy word 33 in redundancy memory array 35A for the addressed segment 102, in response to which read buffers 35RB will provide output data on lines Q to redundancy ECC circuit 31. After error correction and detection, the resulting corrected (if necessary) address and enable states stored in the accessed redundancy word are provided by redundancy ECC circuit on lines RED_ADDR/EN to buffers 32R, 32C (FIG. 3).

According to this embodiment of the invention, and as mentioned above, each redundancy word 33 includes a number of data bit cells $42_d$ for storing parity bits generated from the data and enable portion of that redundancy word 33 according to an error correction code. As such, one or more errored bits in redundancy word 33 can be detected and, depending on the code, corrected. A typical example of such an error correction scheme applied to redundancy memory 35 in this example is a double-detect, single-correct coding.

According to this embodiment of the invention, the reliability of redundancy memory 35 is enhanced by the re-writing of corrected data into redundancy memory 35 upon the detection of a single-bit error. In this manner, errors in the stored redundancy information will tend not to accumulate over time. Redundancy control circuit 27 of the embodiment of the invention shown in FIG. 6 includes the appropriate circuitry for attaining that enhanced reliability, as will now be described with reference to FIG. 6.

As mentioned above, one input of multiplexer 70A receives the FRAM segment address from read/write control circuitry 65, one input of multiplexer 70W receives write enable signal WE from read/write control circuitry 65, and one input of multiplexer 70Q receives input data on lines D_IN from read/write control circuitry 65. According to this embodiment of the invention, a second input of multiplexer 70A receives scrub address value SCRUB_ADDR from scrub pointer register 58, while a second input of multiplexer 70W receives write enable signal WE_SCRB from scrub pointer register 58. A second input of multiplexer 70Q receives the corrected contents for an addressed redundancy word on lines Q_WB from redundancy ECC circuit 31.

Scrub pointer register 68 contains the appropriate logic for issuing a control signal on line SCRUB, as well as for issuing a scrub address value on lines SCRUB_ADDR and the write enable signal on line WE_SCRB, in response to an indication of error from redundancy ECC circuit 31. In this example, scrub pointer register 68 receives signal SEC from redundancy ECC circuit 31, that signal indicating that a single-bit error was detected and correctable in the most recently accessed redundancy word 33.

According to this embodiment of the invention, scrub pointer register 68 initiates a "scrub" of one of redundancy words 33 upon a read of that word having a single-bit correctable error. In this example, scrub pointer register 68 drives an active level of control signal SCRUB in response to an indication via signal SEC that the most recently accessed redundancy word 33 had such a single-bit error. In combination with this control signal SCRUB in this event, scrub pointer register 68 also issues the address of the errored redundancy word to multiplexer 70A on lines SCRUB_ADDR, and an active level of write enable signal WE_SCRB to multiplexer 70W. The active level of control signal SCRUB causes multiplexer 70A to select the address on lines SCRUB_ADDR for application to row decoder 35RD, and to apply the write enable signal on line WE_SCRB to write buffers 35WB. Meanwhile, the corrected contents of the accessed redundancy word 33 are provided on lines Q_WE by redundancy ECC circuit 31, and multiplexer 70Q applies those contents to write buffers 35WB in response to control signal SCRUB. In this manner, upon detection of a single-bit error, the accessed redundancy word 33 is re-written with the corrected contents in this embodiment of the invention. The accumulation of multiple bit (and thus uncorrectable) errors is thus prevented.

Variations on this approach can also be realized. For example, the single row "scrub" operation can be delayed until a certain number of errored accesses of that redundancy word 33 occur; this minimizes the performance impact of constant re-writing of redundancy data if a "hard" bit error is present in redundancy memory 35. Scrub pointer register 68 can, in this case, include counters to maintain the appropriate error counts for the redundancy words 33 in array 35A.

FIG. 6 also illustrates signal DED issued by redundancy ECC circuit 31. According to another variation or alternative, this signal DED indicates whether the most recently read contents of one of redundancy words 33 contains an uncorrectable error, for example two errored bits in a double-detect, single-correct ECC scheme. This signal DED may be forwarded to peripheral circuitry 29 or other control circuitry associated with FRAM 18, in response to which one or all of redundancy words 33 are re-written with the contents of segment 102R in similar manner as occurred on power-up, thus removing the uncorrectable errored condition.

These error correction and flush operations are optional in connection with embodiments of this invention. However, when used in combination with the power reduction approach of this invention, the utility of FRAM 18 in a high-reliability application is enhanced even further.

Embodiments of this invention thus provide a low power arrangement for the use of high-performance SRAM as redundancy memory. The use of high-performance SRAM, rather than FRAM or some other non-volatile memory, allows for the redundancy match decision to be performed with little or no impact on the memory access cycle time. Embodiments of this invention enable the use of such SRAM redundancy memory while mitigating the power penalty for doing so. As such, this architecture is well-suited for highly power-conscious circuits and systems, for example implantable medical devices. In addition, techniques for improving the reliability of the redundancy decision from a soft-error standpoint are provided by variations on this architecture.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A solid-state memory, comprising:
   a memory array comprising a plurality of memory cells arranged in rows and columns;
   redundant memory cells associated with the memory array; and
   a redundancy memory comprising one or more redundancy words, each redundancy word comprising:
      a plurality of data bit cells for storing at least one memory address value;
      at least one enable bit cell; and
      a power switch circuit, for biasing the plurality of data bit cells in the redundancy word responsive to the at least one enable bit cell being set;
   address match circuitry for comparing a received memory address with at least one of the redundancy words, and for selecting redundant memory cells for access responsive to the received memory address matching the contents of the at least one of the redundancy words in combination with the at least one enable bit cell associated with the matched redundancy word being set.

2. The memory of claim 1, wherein the memory array comprises a plurality of segments, each segment comprised of a plurality of memory cells arranged in rows and columns;
wherein the redundant memory cells comprise a plurality of groups of redundant memory cells, each group associated with one of the segments of the memory array;
and wherein the redundancy memory comprises a plurality of redundancy words, each redundancy word associated with a group of redundant memory cells.

3. The memory of claim 2, wherein the plurality of data bit cells each of the redundancy words store a plurality of address values, each corresponding to addresses in the associated segment to be replaced by redundant memory cells in the associated group;
and wherein each redundancy word includes a plurality of enable bit cells.

4. The memory of claim 3, wherein the power switch circuit in each of the redundancy words biasing the plurality of data bit cells in the redundancy word responsive to a logical combination of the states of the enable bit cells in that redundancy word.

5. The memory of claim 4, wherein the logical combination is a majority encoding.

6. The memory of claim 5, wherein the redundancy memory further comprises:
control circuitry, for storing contents of the redundancy words corresponding to addresses of memory cells to be replaced, and for setting the corresponding enable bit cells for those address values;
wherein the control circuitry sets each of the plurality of enable bit cells in the redundancy word responsive to storing any address value in that redundancy word.

7. The memory of claim 3, wherein each group of redundant memory cells comprises at least one row of memory cells and at least one column of memory cells;
and wherein each redundancy word stores at least one row address value and at least one column address value.

8. The memory of claim 1, wherein the redundancy circuit further comprises:
redundancy error correction circuitry, for performing error correction on the contents of one of the redundancy words when accessed.

9. The memory of claim 8, further comprising:
a plurality of non-volatile memory cells for storing the contents of the redundancy words;
control circuitry for loading the redundancy memory with the contents of the plurality of non-volatile memory cells at power-up of an integrated circuit including the memory;
wherein the redundancy error correction circuitry causes the control circuitry to re-load a redundancy word with corrected contents responsive to the redundancy error correction circuitry detecting an errored bit in the redundancy word.

10. A method of operating a solid-state memory, the memory comprising a memory array comprised of a plurality of memory cells arranged in rows and columns, redundant memory cells associated with the memory array, and a redundancy memory comprising one or more redundancy words, each including a plurality of data bit cells for storing at least one memory address value, and at least one enable bit cell, the method comprising:
setting the state of at least one enable bit cell in that redundancy word;
responsive to the setting of the at least one enable bit cell in a redundancy word, applying power supply bias to data bit cells in that redundancy word; and
storing an address value in data bit cells of the redundancy word indicating addresses of memory cells in the memory array to be replaced by redundant memory cells.

11. The method of claim 10, wherein data bit cells in a redundancy word having an enable bit cell that is not set are isolated from power supply bias.

12. The method of claim 11, wherein the applying step comprises:
forwarding logic states of the enable bit cells of a redundancy word to gating logic for the redundancy word;
coupling the power supply bias to the data memory cells of a redundancy word responsive to an output of the gating logic.

13. The method of claim 12, wherein each redundancy word includes a plurality of enable bit cells;
and wherein the gating logic generates its output responsive to a logical combination of the states of the enable bit cells in its redundancy word.

14. The method of claim 13, further comprising:
responsive to setting one enable bit cell in a redundancy word, setting all enable bit cells in that redundancy word;
wherein the logical combination is majority encoding.

15. The method of claim 14, wherein each redundancy word is associated with a segment of the memory array, each segment of the memory array comprising a plurality of memory cells arranged in rows and columns and comprising redundant memory cells;
and wherein the data bit cells in each of the redundancy words store a row address value and a column address value for a row and column, respectively, of the associated segment to be replaced by redundant memory cells in the associated segment.

16. The method of claim 10, further comprising:
receiving an address of at least one memory cell to be accessed;
accessing a redundancy word in the redundancy memory;
responsive to the received memory address matching a memory address value stored in the accessed redundancy word and the at least one enable bit cell in the matched redundancy word being set, accessing a corresponding redundant memory cell in place of a memory cell corresponding to the received address.

17. The method of claim 16, further comprising:
after the step of accessing the redundancy word, performing error correction on the contents of the redundancy word to correct erred bits.

18. The method of claim 17, further comprising:
responsive to the step of performing error correction correcting at least one erred bit in a redundancy word, storing the contents in that redundancy word.

19. The method of claim 18, further comprising:
at power-up of the solid-state memory, storing contents of a non-volatile memory in at least one of the redundancy words; and
responsive to the step of performing error correction determining that more errored bits are present in a redundancy word than can be corrected, repeating the step of storing the contents of the non-volatile memory in that redundancy word.

* * * * *